United States Patent
McElheny et al.

(10) Patent No.: US 6,472,272 B1
(45) Date of Patent: Oct. 29, 2002

(54) CASTLED ACTIVE AREA MASK

(75) Inventors: Peter J. McElheny, Morgan Hill; Raminda U. Madurawe, Sunnyvale; Richard G. Smolen, Redwood City; Minchang Liang, Santa Clara, all of CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/733,850

(22) Filed: Dec. 8, 2000

Related U.S. Application Data

(62) Division of application No. 09/045,737, filed on Mar. 19, 1998, now Pat. No. 6,187,634.
(60) Provisional application No. 60/066,166, filed on Nov. 19, 1997.

(51) Int. Cl.[7] .............................................. H01L 21/336
(52) U.S. Cl. ........................................ 438/263; 438/942
(58) Field of Search ................................... 438/263, 942

(56) References Cited

U.S. PATENT DOCUMENTS

| | | | |
|---|---|---|---|
| 5,404,037 A | 4/1995 | Manley | |
| 5,432,740 A | 7/1995 | D'Arrigo et al. | |
| 5,504,706 A | 4/1996 | D'Arrigo | |
| 5,764,569 A | * 6/1998 | Wright | 365/185.09 |
| 5,904,524 A | 5/1999 | Smolen | |

* cited by examiner

Primary Examiner—Howard Weiss
(74) Attorney, Agent, or Firm—Beyer, Weaver & Thomas, LLP

(57) ABSTRACT

Provided is a "castled" active area mask. A castled active area mask is one which has been lengthened to extend beyond its intended intersection with a tunnel dielectric to form the tunnel window of an EEPROM cell, and has also been widened in at least a portion of the extension. For example, in one preferred embodiment, a castled extension may have a "T" shape. The castled active area generated by such a mask provides a buffer to absorb field oxide encroachment before it reaches the EEPROM cell's TD window. A mask in accordance with the present invention may be used to fabricate EEPROM cells which are not subject to TD window size variations due to field oxide encroachment, and EEPROM cell arrays of increased density.

12 Claims, 7 Drawing Sheets

ACTIVE AREA     MASK

CASTLED ACTIVE AREA MASK

CROSS-REFERENCE TO RELATED APPLICATIONS

This application is a division of application Ser. No. 09/045,737, filed Mar. 19, 1998, now U.S. Pat. No. 6,187,634, which claims the benefit of the filing date of Provisional Application Serial No. 60/066,166 entitled EEPROM Active Area Castling to Avoid Tunnel Dielectric Window Size Variations and Reduce Cell Size Area, filed Nov. 19, 1997, the disclosure of which is incorporated by reference herein for all purposes.

BACKGROUND OF THE INVENTION

The present invention relates generally to electrically erasable/programmable read only memory (EEPROM) cells. More particularly, the invention relates to modifications to active area masks to avoid tunnel dielectric window size variations and reduce cell area.

Conventional nonvolatile memory cells include EPROM, Flash and EEPROM cells. EPROM cells are electrically programmed by moving electrons onto the cell's floating gate via hot electron injection, and optically erased (removing electrons from the floating gate) by exposure of the cell to UV radiation. EEPROM cells are both electrically programmed and electrically erased by moving electrons on and off the cell's floating gate via Fowler-Nordheim tunneling. Flash cells have elements of both EPROMs and EEPROMs: they are electrically programmed by hot electron injection and electrically erased by Fowler-Nordheim tunneling. Each of these memory cells have particular applications for which they are best suited.

EEPROM cells have the advantages that they need not be exposed to UV radiation for erasure, and they do not require the cell circuitry necessary for generating fields sufficient for hot electron injection. Therefore, EEPROMs a re preferred in applications where these requirements would make it impractical or impossible to use an EPROM or FLASH cell.

FIG. 1A shows it perspective view of a typical EEPROM cell. The cell 30 is a single polysilicon EEPROM cell. As such, it does not have a polysilicon control gate, but instead has a heavily doped diffusion region in the cell's substrate which is capacitively coupled to its floating gate. The cell 30 includes a single polysilicon floating gate structure 32 which performs three functions. At a first end, a tunnel extension 34 of floating. gate 32 acts as an electrode in the two terminal device used for tunneling electrons from a heavily doped N+ implant 35 (also referred to as a programming Memory Diffusion or MD) through a tunnel oxide 36 (often about 80 Å thick) onto floating gate structure 32. At the other end of this floating gate, a wide area plate 38 is employed as one electrode of a capacitor enabling the floating gate 32 to be raised to a high voltage (e.g., about 6 to 11 volts) by capacitively coupling a programming voltage (e.g., about 9 to 13 volts) from a second electrode 40 (heavily doped N+ silicon, referred to herein as a control gate memory diffusion) through an oxide 42 (often about 180 Å thick). Between these two ends is a section of polysilicon that forms the gate 44 of a read transistor (N2).

The read transistor (N2) is connected in series with a word line transistor. (N1) having a gate 46 forming part of a word line (also referred to as a row line) 31. The read and word line transistors separate a sense amp negative (−) input 48 (a source line) from a sense amp positive (+) input 50 (a drain line). Charging the floating gate 32 by tunneling electrons onto it (through tunnel oxide 36) raises the threshold voltage of the read transistor (EEPROM cell 30 is programmed). This shuts off the channel between the sense amp inputs, even when the adjacent word line transistor is turned on. Tunneling electrons off the floating gate 32 reduces the read transistor threshold voltage to negative values, effectively turning this device on (EEPROM cell 30 is erased). The word line transistor in series then controls the signal path between the two sense amp inputs 48 and 50.

The EEPROM cell is programmed or erased by charging or discharging, respectively, the floating gate 32. In order to tunnel electrons onto floating gate 32, a high voltage must be applied to the control gate memory diffusion 40. At the same time, the write column 56 is grounded and the write column transistor (N3) is turned on by, for example, selecting the row line 31 with, for example, 5 volts. The sense amp (−) input 48 can be biased from about 5 volts to a high voltage to assist tunneling electrons onto the floating gate 32. The voltage on the control gate memory diffusion 40 is capacitively coupled to the floating gate 32 as is the sense amp (−) input 48 voltage. The resulting positive voltage on floating gate 32 is sufficient to cause tunneling onto floating gate 32 through the tunnel oxide 36 where it intersects the floating gate (the tunnel oxide window 36a (shaded)), thereby programming the EEPROM cell 30.

In order to tunnel electrons off floating gate 32, a high voltage must be applied to memory diffusion 35 while ground is applied to the second heavily doped N+ implant (control gate memory diffusion) 40 which underlies and is capacitively coupled to the wide area plate 38. During this process, ground is also applied to sense amp (−) input 48. The application of high voltage to memory diffusion 35 is accomplished through a write column 56 and a write column select transistor (N3) including (i) a diffusion region 54 conductively connected to write column 56 for data input, (ii) a source/drain diffusion 58 electrically connected to memory diffusion 35, and (iii) a gate electrode 60, which is part of row line 31. When a sufficient potential is applied to the gate 60 of the write column select transistor through row line 31 while a write signal is applied through write column 56, electrons can tunnel off of the floating gate 32 to erase the EEPROM cell.

A further description of a typical EEPROM cell and its functional elements is available the publication "EPM7032 Process, Assembly, and Reliability Information Package" available from Altera Corporation of San Jose, Calif. That document is incorporated herein by reference for all purposes.

In EEPROM cells, it is very important to have a tunnel dielectric (TD) window (defined here as the cross-section of the overlapping TD and active layers) that is free of any undue window size variations that effect the cell performance. It is thus important to minimize variations in size of the TD window that may occur naturally due to processing variations. FIG. 2 shows conventional masks for the active area and tunnel dielectric which intersect to form the tunnel windows 202 and 212 for two adjacent EEPROM cells 200 and 210, respectively, of an EEPROM array on a semiconductor die 220. Referring to EEPROM cell 200 as an example, the active area mask 204 is narrowed in the region of the tunnel dielectric mask 206 in order to provide the smallest tunnel window area possible, and allow for the smallest possible control gate area (not shown), thereby reducing the EEPROM cell's overall size.

In this figure, dimension "A" is the cell height which needs to be minimized in order to achieve the smallest possible die area. Dimension "B" is the inter-cell distance which typically must be greater than some minimum value to avoid active-to-active area current leakage between adjacent cells. The extent to which the active area mask extends beyond its overlap with the TD layer mask is labeled as dimension "C". The width of the tunnel dielectric is labeled as dimension "W" of the tunnel dielectric mask 206. The width of the active area mask 204 is labeled as dimension "D." The tunnel window 202, 212 area, therefore, is defined by W×D. These labels are used to assist is describing active area masks throughout the present application.

Two separate effects may be responsible for TD window size variations during wafer processing. First of all, there is typically a loss of resolution in the transfer of the image of the desired feature from a mask to a photoresist, particularly in corners and tight spaces of an image. This results in a rounding of corners which generally decreases the size of the feature produced by the mask. In EEPROM processing, this phenomenon may reduce the size of the active area in the final product resulting from the active area mask. The active area is typically further reduced in size by a physical process, namely encroachment of field oxide, typically generated by thermal processes, into the mask area, particularly at corners and tight spaces of the mask. These combined optical and physical effects typically shrink the active area relative to its mask and, unless preventive measures are taken, result in encroachment of the field oxide into the tunnel window, thereby reducing its size and producing a corresponding undesirable change in the properties of the EEPROM cell.

This problem is illustrated in FIG. 3A. The desired tunnel window 300 is defined by the intersection of the active area mask 302 (having a width of dimension "D") and the tunnel dielectric mask 304. As noted above, in conventional EEPROM design, the active area mask 302 typically extends a few Angstroms beyond the edge of the tunnel dielectric mask 304 (dimension "C") to ensure that the desired area for the tunnel window 300 is obtained even in the event of an imperfect alignment of the two masks during processing. The broken line 306 represents the shape of the active area following photolithographic processing and field oxidation. As shown in the figure, the reduction in size of the actual active area relative to the active area mask 302 due to the optical and physical problems noted above results in encroachment of field oxide into the tunnel window 300. Field oxide encroachment is particularly pronounced at the corners of the active region due to two-dimensional corner effects. This makes the field oxide encroachment in the direction of the TD window 300 greater at the edges than in the center of the active area. Therefore, the edges of the active area define the limit of how large of an active layer overlap is required to avoid field oxide encroachment into the TD window.

In order to address this problem, EEPROM cells have been designed in which the active area extends beyond the tunnel dielectric towards an adjacent EEPROM cell in the array an amount sufficient such that encroachment into the region defined by the active area mask does not reach the tunnel window. This approach is illustrated in FIG. 3B. This extension ("C'") of the active area mask 312 beyond the tunnel dielectric mask 314, is typically about 1 micron in length for a 0.5 micron device size EEPROM cell, and results in an active area boundary 316 that does not encroach upon the tunnel window 310. Since the distance between adjacent EEPROM cells of an array, referred to as "B" in FIG. 2, must be maintained in order to prevent charge leakage between active areas of adjacent cells (which would have a detrimental effect on array performance), the presence of the longer active area extension (C'>C) means that the EEPROM cell size, referred to as A in FIG. 2, is increased. However, this increased A distance (C'+B) in the EEPROM array is undesirable since it decreases cell density on a die, requiring either a larger die for the same number of cells or that fewer cells be placed on die of a given size.

An alternative solution to the tunnel window encroachment problem is shown in FIG. 3C. This approach combines an extension (C) of the active area mask 322 beyond the dielectric mask 324 of no more than that conventionally used, however the active area mask 322 has a greater width (D'>D) in the region of the tunnel window. This solution also may prevent encroachment of field oxide into the tunnel window 320 since the wider active area produced by this mask is not as susceptible to field oxide encroachment. However, it results in an increase in the area of the tunnel window 320 which also requires associated increases in size of other elements in the EEPROM array (such as the control gate), again resulting in an increased cell size and a decrease in the density of arrayed EEPROM cells for a given die area.

Therefore, it would be desirable to have an EEPROM active area mask design which would minimize the amount of active layer overlap (the extent to which the active area of a cell extends beyond the tunnel dielectric towards an adjacent cell in an array) and thus the cell size, while preventing TD window size variations due to field oxide encroachment.

SUMMARY OF THE INVENTION

To achieve the foregoing, the present invention provides a "castled" active area mask. A castled active area mask is one which has been lengthened to extend beyond its intended intersection with a tunnel dielectric to form the tunnel window of an EEPROM cell, and has also been widened in at least a portion of the extension. For example, in one preferred, embodiment, a castled extension may have a "T" shape. The castled active area generated by such a mask provides a buffer to absorb field oxide encroachment before it reaches the EEPROM cell's TD window. A mask in accordance with the present invention may be used to fabricate EEPROM cells which are not subject to TD window size variations due to field oxide encroachment, and EEPROM cell arrays of increased density.

In a preferred embodiment, the present invention provides an EEPROM active area mask, having a main body portion, a window portion having a length dimension, and a width dimension about normal to said length dimension, where the window portion extends from the main body portion axially with the length dimension, and an extension portion extending from the window portion axially with the length dimension. The mask also includes castle features extending from at least a part of the extension portion axially with the width dimension. Use of the mask in fabrication of an EEPROM cell results in a final active area in which the starting dimensions of a tunnel window defined by the window portion are not substantially changed. The invention also provides a partially-formed EEPROM cell and a method of making an EEPROM cell using a castled active area mask.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details.

In other instances, well known process operations have not been described in detail in order not to unnecessarily obscure the present invention.

The present invention provides a "castled" active area mask. A castled active area mask is one which has been lengthened to extend beyond its intended intersection (overlap) with a tunnel dielectric to form the tunnel window of an EEPROM cell. A castled oxide has also been widened in at least a portion of the extension, so that, for example in one preferred embodiment, a castled extension may have a "T" shape. The castled active area generated by such a mask provides a buffer to absorb field oxide encroachment before it reaches the EEPROM cell's TD window. A mask in accordance with the present invention may be used to fabricate EEPROM cells with a relatively small cell size which are not subject to TD window size variations due to field oxide encroachment. Thus, the density of arrays of EEPROM cells fabricated in accordance with the present invention may be increased relative to conventional designs.

Figure 4:
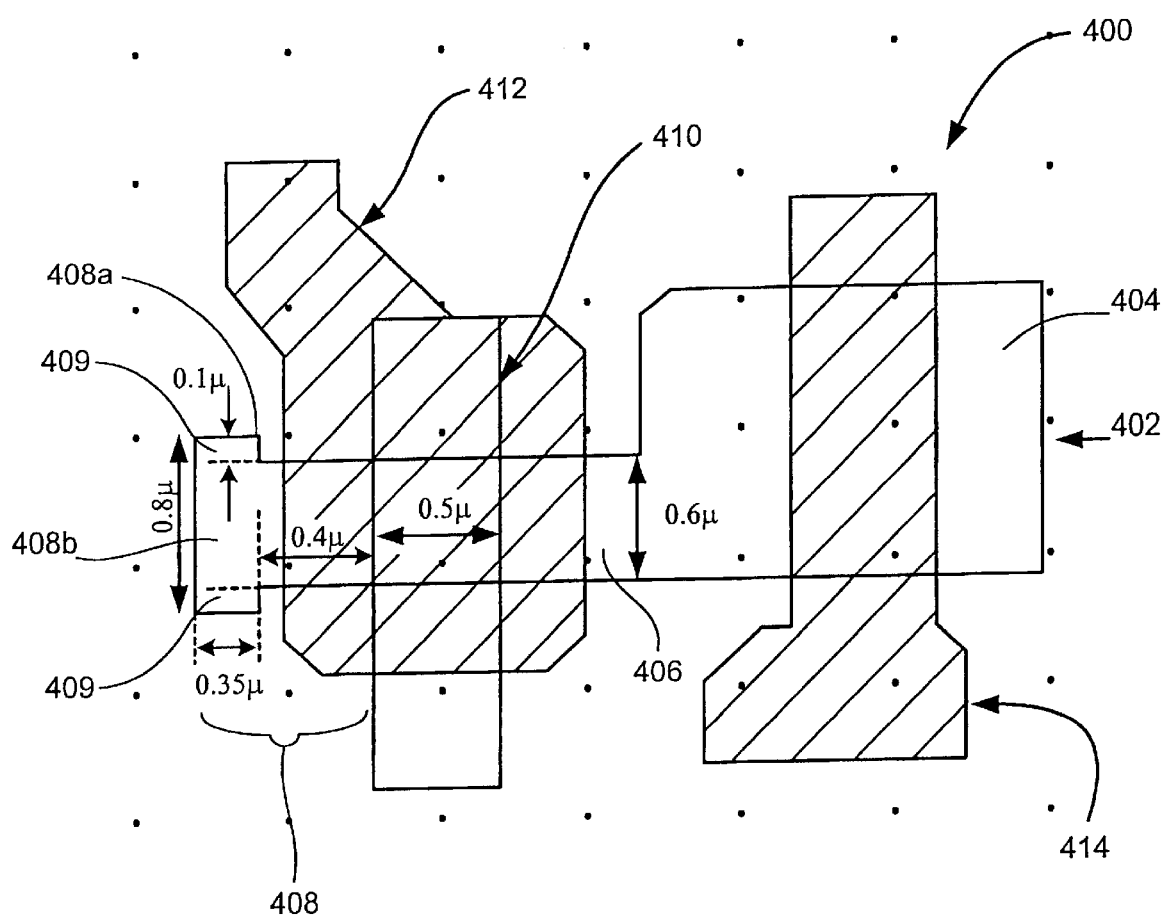
FIG. 4 shows one preferred embodiment of a castled active area mask in accordance with the present invention, assembled with masks for other elements of an EEPROM cell.

A variety of different castling forms may satisfy the objectives of the present invention. FIG. 4 shows one preferred embodiment of a castled active area mask in accordance with the present invention, assembled with masks for other elements of an EEPROM cell. The mask assembly 400 includes an active area mask 402, having a main body 404 which narrows to a window portion 406 that laps with a tunnel dielectric formed by a tunnel dielectric mask 410 to form the EEPROM cell's tunnel window. The active area mask 402 also has a castled extension portion 408, which extends beyond the window portion 406. Also shown in FIG. 4 are masks representing a floating gate 412 and word line 414 of the completed EEPROM cell.

In the embodiment shown in FIG. 4, dimensions are shown for one preferred embodiment of a castled active area 402 in accordance with the present invention, for a 0.5 $\mu$m device size EEPROM cell. The window portion 406 of the active area 402 is 0.6 $\mu$m wide. The extension portion 408 has a 0.4 $\mu$m long non-castled portion 408a, and a 0.35 $\mu$m long castled portion 408b. The casting 409 on the castled portion 408b of the extension 408 adds 0.1 $\mu$m to each side of that portion of the extension 408b, so that the total width is 0.8 $\mu$m in the castled area. As described further below, these dimensions are for just one example of a castled active area mask; many other castling patterns and dimensions are also possible within the scope of the present invention.

Figure 1:
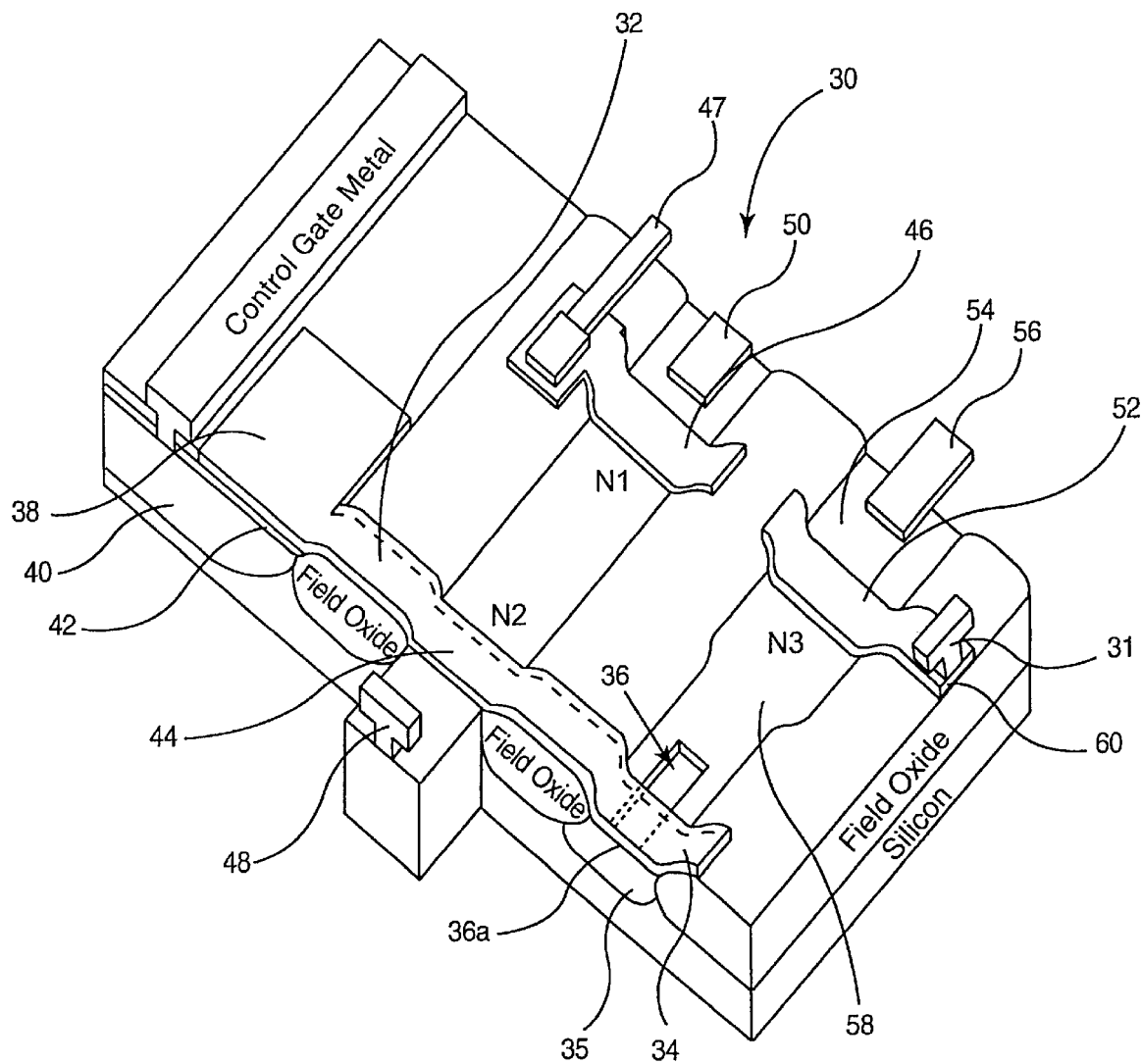
FIG. 1A shows a perspective view of a conventional EEPROM cell.
FIG. 1B shows additional detail on the structure of the programming and erasing portion of a typical conventional EEPROM cell.
Figure 2:
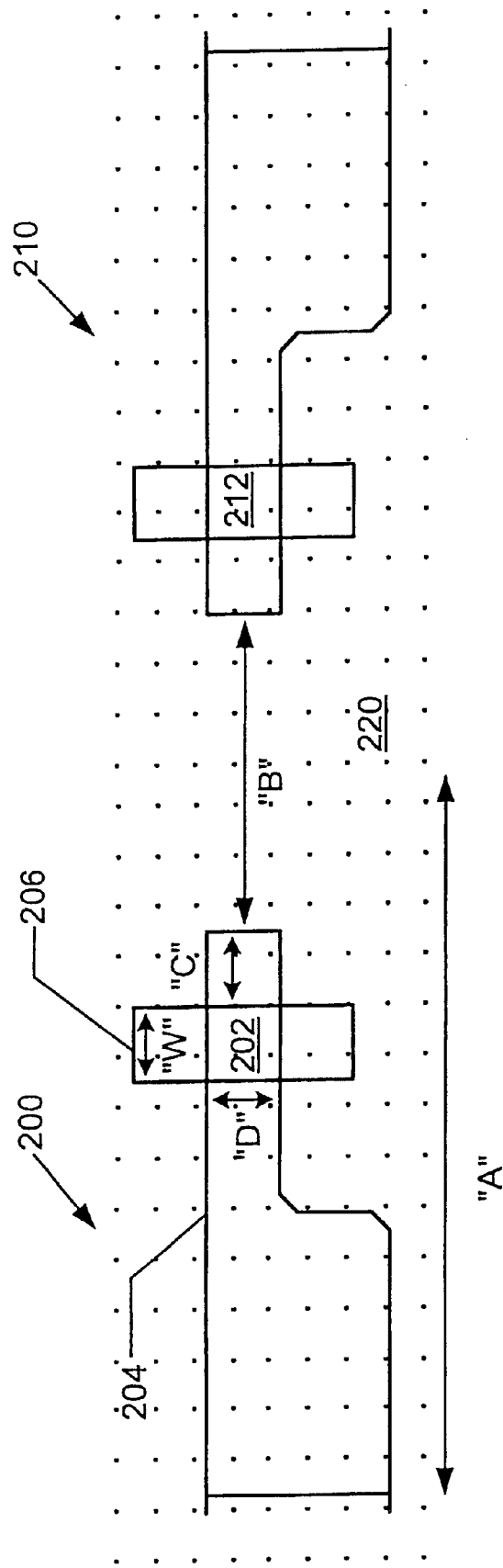
FIG. 2 shows conventional masks for the active area and tunnel dielectric which intersect to form the tunnel windows for two adjacent EEPROM cells of an EEPROM array on a semiconductor die.
Figures 3A, 3B, 3C:
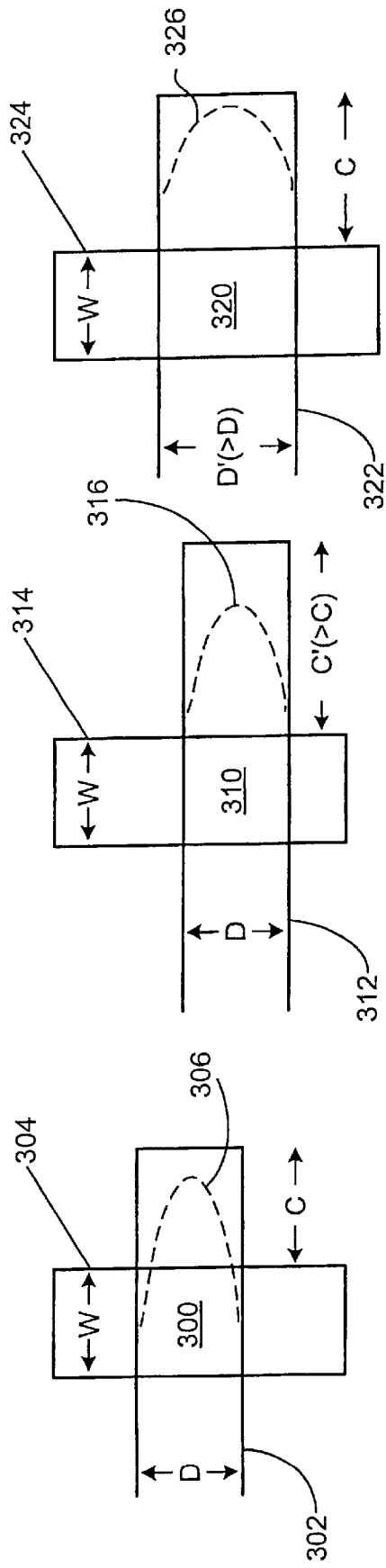
FIG. 3A shows field oxide encroachment into the tunnel window area of a conventional EEPROM cell due to combined optical and physical effects of processing.
FIGS. 3B and 3C show modifications to active area masks to prevent field oxide encroachment into the tunnel window area of a conventional EEPROM cell during processing.
Figure 5:
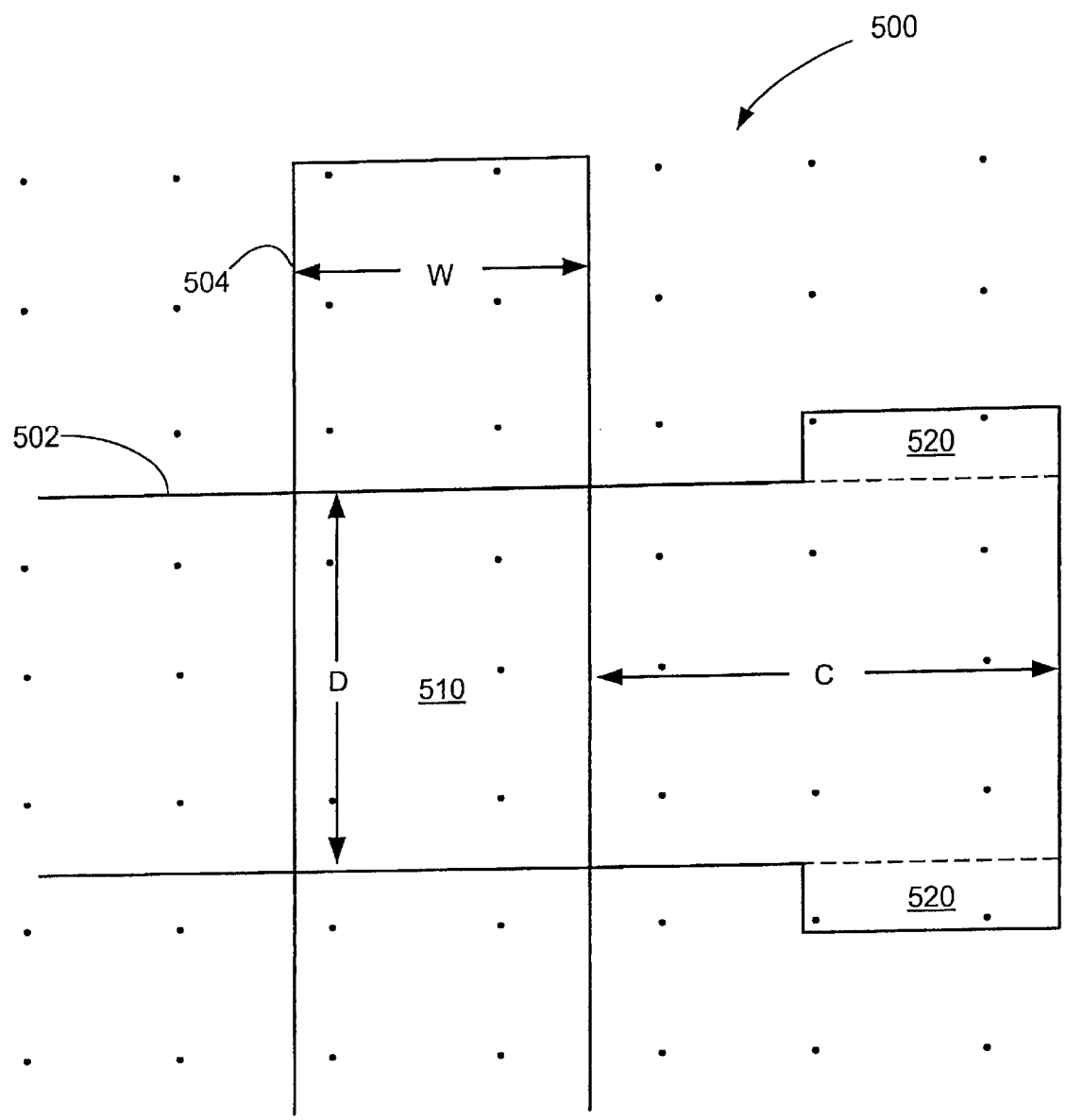
FIG. 5 shows an isolated view of a preferred embodiment of tunnel window and castled portions of an active area mask in accordance with the present invention, together with a tunnel dielectric mask.

FIG. 5 shows an isolated view 500 of a preferred embodiment of tunnel window and castled portions of an active area mask 502 in accordance with the present invention, together with a tunnel dielectric mask 504. A partially formed EEPROM cell fabricated with the use of these masks 502 and 504 would also have the structure illustrated by FIG. 5. In order to decrease the cell size ("A" dimension, as described above with reference to FIG. 2), and thereby decrease the cell size and increase the array density, the C dimension needs to be decreased since the B dimension (distance between adjacent EEPROM cells, not shown) must remain constant in order to provide an adequate safety margin against active-to-active area current leakage between adjacent EEPROM cells in an array. As noted previously, in a conventional 0.5 $\mu$m device size cell, the C dimension is typically about 1 micron, which is about two times the device size, and two times the W dimension of the tunnel window. In a preferred embodiment of the present invention, the C dimension is preferably about 0.2 to 2 W, more preferably about 0.5 to 1.5 W, and most preferably about 0.8 W. Therefore, for example, in a 0.5 micron device size EEPROM cell, the most preferred value for the C dimension is about 0.4 microns. The width of the non-castled portion of the active area extension is preferably between about W and 2 W, most preferably about W.

The dimensions of the castle features (the portions 520 of the active area extension C which is extended beyond the D dimension) on the active area extension, C, in accordance with the present invention should be suitable to prevent encroachment of field oxide into the tunnel window area 510 during subsequent processing. These dimensions may be determined empirically for a given process and cell size by a procedure easily practiced by those of skill in the art. A variety of masks having different incremental castled forms may be used to produce active areas for tunnel windows on a common substrate.

Following normal processing to generate a tunnel window, the substrate wafer may be examined to determine the extent of castling necessary to avoid field oxide encroachment for that given process and device design. The most desirable forms for the active area mask are those which minimize C+B, while preventing field oxide encroachment into the tunnel window of the completed cell.

The preferred dimensions of the castle features of an active area mask in accordance with the present invention may be conveniently provided in layout grid increments. A layout grid for semiconductor device designs may be described as an array of increments. An increment represents the minimum resolution with which a mask may be drawn on a layout database. Increments are usually about 1/10 of the device size. Typical device sizes and their corresponding grid increment sizes are as follows: 0.5 μm device size—0.05 μm layout grid (that is, square increments having 0.05 μm sides); 0.35 μm device size—0.025 μm layout grid; 0.25 μm device size—0.025 μm layout grid; and 0.18 μm device size—0.0125 μm layout grid. In general, the castle portion 520 will be about 1 to 10 increments in length (C dimension) and 1 to 4 increments in width (D dimension); preferably about 1 to 2 increments in length by 1 to 2 increments in width; most preferably about 2 increments by 2 increments. There is preferably a castle portion located on both sides of the extension, C, at its terminus.

That portion of dimension C of the extension which is not castled is the inner portion of the extension having a narrower width, D preferably about W. Larger widths may also be used in the present invention, although less preferably, since they increase overall cell size.

Figure 6A:
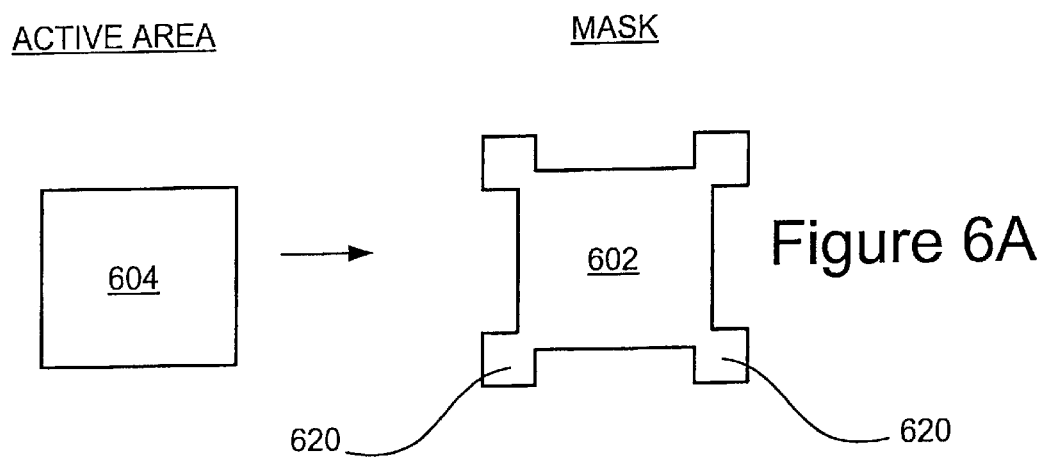
FIGS. 6A and 6B show alternative embodiments of castled active area masks according to preferred embodiments of the present invention.
Figure 6B:
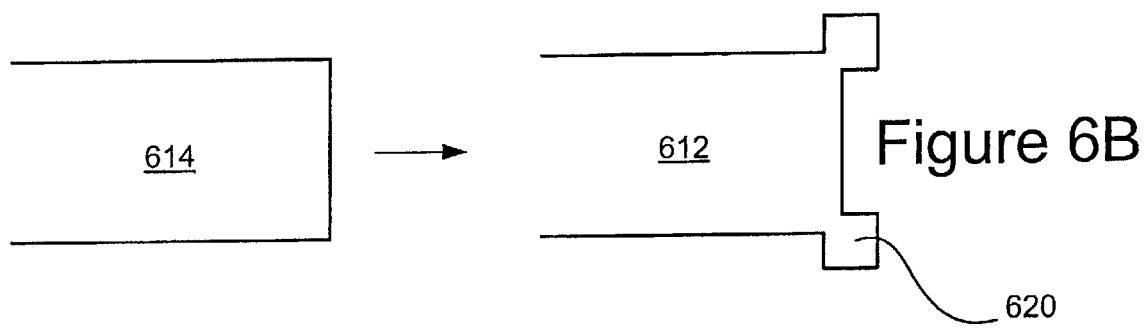

EEPROM cells having castled actives may be fabricated according to conventional processes with the substitution of castled masks for conventional masks in active area formation. FIGS. 6A and 6B show alternative embodiments of castled active area masks according to preferred embodiments of the present invention. The shape of the active mask 602 and 612, respectively, to be used in the fabrication process is shown to the right of the corresponding desired form of the active area 604 and 614 in the final product. These designs are shown with preferred 2×2 increment castle features 620.

The present invention provides a number of advantages over conventional designs including the ability to increase the safety margin between cells in an array having the same footprint as conventional designs; that is, active-to-active current leakage between cells is even less likely since the C+B dimension remains the same, with a larger portion of the dimension being made up by the B distance since the C distance is decreased. More preferably, the invention may be used to maintain the original safety margin (B dimension) between adjacent cells and EEPROM array, but while decreasing cell and array size by decreasing the C dimension without causing field oxide encroachment into the tunnel window area. Moreover, castling of the active area in accordance with the present invention may also permit the final EEPROM cell array size to be further reduced since the required safety margin ("B") between adjacent cells in an array may also be reduced because the average field oxide thickness in this area may be thicker when castling the active area. This occurs because the field oxide is thickest at its center point between active areas of adjacent cells, and it gradually decreases in thickness as the active areas are approached. This is often referred to as the "bird's beak" profile. The slope of the bird's beak profile is very sensitive to the width of the active region and may be more abrupt for the for the wider castled active area. As a result, the average field oxide thickness may increase when castled actives are used.

Figure 7:
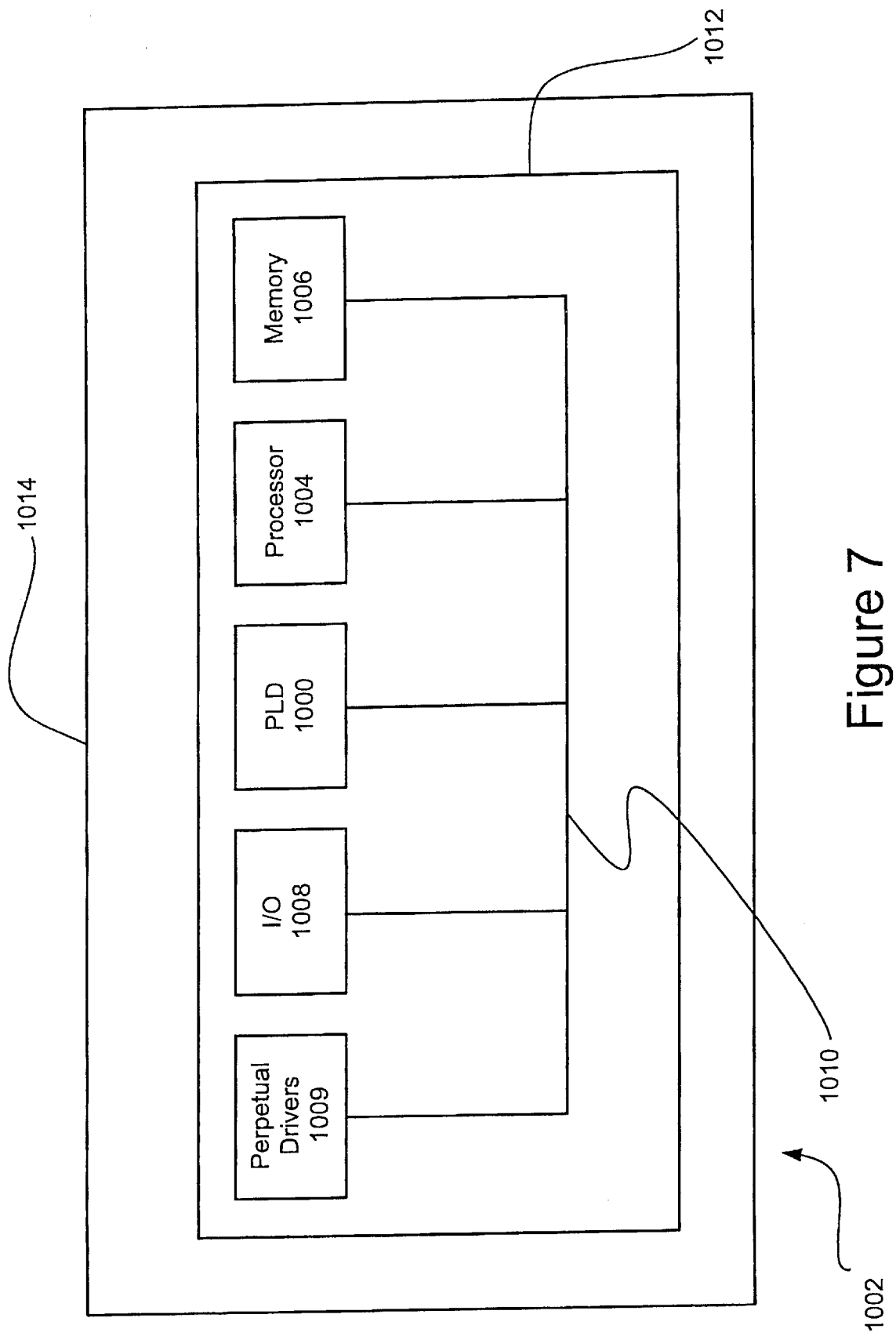
FIG. 7 shows a block diagram of a PLD in a data processing system, with which EEPROM cells in accordance with the present invention may be used.

EEPROM cells in accordance with the present invention may be used as part of a PLD 1000 in a data processing system 1002, as shown in FIG. 7. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An EEPROM active area mask, comprising:

a main body portion;

a window portion having a length dimension, and a width dimension about normal to said length dimension, said window portion extending from said main body portion axially with said length dimension;

an extension portion extending from said window portion axially with said length dimension; and castle features extending from at least a part of said extension portion axially with said width dimension;

such that use of said mask in fabrication of an EEPROM cell results in a final active area in which the starting dimensions of a tunnel window defined by said window portion are not substantially changed.

2. The mask of claim 1, wherein said extension portion extends from said window portion axially with said length dimension from about 0.2 to 2 W, where W is the width of said window portion.

3. The mask of claim 2, wherein said extension portion extends from said window portion axially with said length dimension from about 0.5 to 1.5 W.

4. The mask of claim 3, wherein said extension portion extends from said window portion axially with said length dimension about 0.8 W.

5. The mask of claim 1, wherein said extension portion extends from said window portion axially with said length dimension about 0.4 μm.

6. The mask of claim 1, wherein said window portion has a width of from about W to 2 W, where W is the device size of the cell.

7. The mask of claim 6, wherein said window portion has a width of about W.

8. The mask of claim 1, wherein said castle features are about 1 to 10 layout grid increments in length and 1 to 4 layout grid increments in width.

9. The mask of claim 8, wherein said castle features are about 1 to 2 increments in length by 1 to 2 increments in width.

10. The mask of claim 9, wherein said castle features are about 2 increments by 2 increments.

11. The mask of claim 1, wherein said castle features are at the terminus of said extension portion.

12. An EEPROM active area mask, comprising:

a main body portion;

a window portion having a length dimension and a width dimension about normal to said length dimension, said window portion extending from said main body portion axially with said length dimension;

an extension portion extending from said window portion axially with said length dimension; and castling means extending from said window portion, such that use of said mask in fabrication of an EEPROM cell results in a final active area in which the starting dimensions of a tunnel window defined by said window portion are not substantially changed.

* * * * *